(12) United States Patent
Fukuda et al.

(10) Patent No.: US 8,189,641 B2
(45) Date of Patent: May 29, 2012

(54) SEMICONDUCTOR DEVICE (75) Inventors: Toshiyuki Fukuda, Kyoto (JP);
Mitsuhiro Mishima, Kyoto (JP); Isao Hayami, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/540,070

(22) Filed: Aug. 12, 2009

(65) Prior Publication Data
US 2010/0128750 A1    May 27, 2010

(30) Foreign Application Priority Data

Nov. 21, 2008 (JP) ................. 2008-298485

(51) Int. Cl.
*H01S 5/00* (2006.01)
(52) U.S. Cl. ............ 372/50.121; 372/36; 372/50.1; 372/50.12; 257/79; 257/184; 257/228; 257/290; 257/431; 257/918; 257/88; 257/E33.056; 257/E33.067; 257/21; 438/26; 438/27; 438/28; 313/512; 313/498; 313/499; 313/501; 313/482
(58) Field of Classification Search ............ 372/50.121, 372/50.1, 50.12, 36; 257/88, 79, 431, 736, 257/918, 13, 21, E33.56, E33.067; 313/512, 313/498, 499, 501, 487; 438/26–28
See application file for complete search history.

(56) References Cited

U.S. PATENT DOCUMENTS

| 4,901,325 | A | 2/1990 | Kato et al. | |
| 5,513,201 | A * | 4/1996 | Yamaguchi et al. | 372/75 |
| 6,587,481 | B1 | 7/2003 | Seong et al. | |
| 6,876,149 | B2 * | 4/2005 | Miyashita | 313/512 |
| 7,049,746 | B2 * | 5/2006 | Mano et al. | 313/512 |
| 2006/0028935 | A1 | 2/2006 | Mori et al. | |
| 2006/0261365 | A1 * | 11/2006 | Hsu | 257/100 |

FOREIGN PATENT DOCUMENTS

| JP | 2006-120283 | 5/2006 |
| JP | 2007-311680 | 11/2007 |

OTHER PUBLICATIONS

JP 2007-311680 (English translation) Nov. 29, 2007, pp. 1-9.*
JP 2006-120283 (English translation) Nov. 5, 2006, pp. 1-35.*

* cited by examiner

*Primary Examiner* — Tod T Van Roy
*Assistant Examiner* — Delma R Forde
(74) *Attorney, Agent, or Firm* — McDermott Will & Emery LLP (57) ABSTRACT The semiconductor device includes: a base; a first mount placed on the bottom of the base; a second mount placed on the top of the base; a first light-emitting element placed on the bottom of the first mount; and a second light-emitting element placed on the top of the second mount for emitting light. The first light-emitting element and the second light-emitting element are placed so that the emission direction of light from the second light-emitting element is at an angle of depression with respect to the emission direction of light from the first light-emitting element and that the emission direction of light from the first light-emitting element and the emission direction of light from the second light-emitting element substantially coincide with each other as viewed from above the base.

9 Claims, 7 Drawing Sheets

FIG. 9C

SEMICONDUCTOR DEVICE

CROSS-REFERENCE TO RELATED APPLICATIONS

This application claims priority from Japanese Patent Application JP2008-298485 filed on Nov. 21, 2008, the disclosure of which application is hereby incorporated by reference into this application in its entirety for all purposes.

BACKGROUND OF THE INVENTION

The technology disclosed in the present specification relates to a semiconductor device and more particularly to a semiconductor device for reading information from a medium such as a compact disc (CD), a digital versatile disc (DVD), and a Blu-ray disc (BD), for example, or writing information into such a medium, using light emitting lasers of a plurality of wavelengths, and a fabrication method for such a semiconductor device.

The structure of an optical pickup using a conventional semiconductor device is as follows.

That is, the arrangement is made to allow a first light beam emitted from a first light-emitting element for CD and DVD to pass through a first relay lens, then an aberration correction lens, and thereafter a first object lens to finally form an image on a track of a medium. The arrangement is also made to allow a second light beam emitted from a second light-emitting element for BD to pass through first a second relay lens, then the aberration correction lens, and thereafter a second object lens to finally form an image on a track of a medium.

Japanese Laid-Open Patent Publication No. 2006-120283, for example, describes a technique similar to that described above. Also, Japanese Laid-Open Patent Publication No. 2007-311680 discloses an invention in which a plurality of light-emitting elements are accommodated in one semiconductor device.

SUMMARY OF THE INVENTION

In the semiconductor device described in Japanese Laid-Open Patent Publication No. 2007-311680, a first light-emitting element is adapted to emit light having a wavelength of 780 nm for CD and light having a wavelength of 650 nm for DVD, while a second light-emitting element is adapted to emit light having a wavelength of 405 nm for BD. The wavelength of the light for DVD is made shorter than that for CD, and the wavelength of the light for BD is made shorter than that for DVD, to thereby gradually reduce the size of the images formed on tracks of a CD, a DVD, and a BD, and hence enhance the recording density in this order.

However, in the conventional semiconductor devices described above, downsizing of an optical pickup is not sufficiently attained in some cases. The light beam emitted from the second light-emitting element for BD is not only short in wavelength but also small in diameter immediately after the emission. Hence, when this light beam is allowed to pass through the second relay lens, the adjustment by the second relay lens will not work effectively, resulting in failure in stable write/read into/from a BD.

In the conventional semiconductor device, the light for BD is made to pass through the BD-dedicated second relay lens, and hence the first and second relay lenses are required. This impedes downsizing of the optical pickup.

According to a semiconductor device of an example of the present invention, an apparatus for writing/reading data can be downsized, and optical axis adjustment can be facilitated.

The semiconductor device of an example of the present invention includes: a base; a first mount placed on the bottom of the base; a second mount placed on the top of the base: a first light-emitting element placed on the bottom of the first mount; and a second light-emitting element placed on the top of the second mount for emitting light, wherein the first light-emitting element and the second light-emitting element are placed so that the emission direction of light from the second light-emitting element is at an angle of depression with respect to the emission direction of light from the first light-emitting element and that the emission direction of light from the first light-emitting element and the emission direction of light from the second light-emitting element substantially coincide with each other as viewed from above the base.

With the above configuration, the adjustment of the optical axes of light beams of different wavelengths emitted from the first light-emitting element and the second light-emitting element is facilitated, and the number of members used for optical-axis alignment and the like can be reduced compared with the conventional semiconductor devices. Hence, the invention is contributable to downsizing of an optical pickup and the like, for example.

The semiconductor device may further include: a first frame placed on the bottom of the base to surround the first mount and the first light-emitting element except for the side corresponding to the emission direction of light from the first light-emitting element; a plurality of leads electrically connected to any one of the first light-emitting element, the second light-emitting element, the first mount, and the second mount; and a light-transmitting resin placed on the top of the base for hermetically sealing the second light-emitting element, the second mount, and part of each of the plurality of leads. With the first frame, the first light-emitting element can be prevented from physical damage. With the hermetical sealing with the light-transmitting resin, the second light-emitting element can be prevented from degradation even when it is made of a material prone to degradation, permitting stabilization of light output. In particular, when the first frame and the light-transmitting resin are made of the same material, these components can be molded simultaneously, permitting reduction in the number of fabrication steps.

The semiconductor device may further include: a second frame placed on the top of the base to surround the second mount and the second light-emitting element except for the side corresponding to the emission direction of light from the second light-emitting element. With the placement of the first frame and the second frame, the first light-emitting element and the second light-emitting element can be prevented from physical damage. Also, with the hermetical sealing with the light-transmitting resin, the second light-emitting element can be prevented from degradation even when it is made of a material prone to degradation, permitting stabilization of light output.

A first recess having an inclined bottom may be formed on the top of the base, and the second mount may be placed on the first recess.

A second recess having an inclined bottom may be formed on the bottom of the base, and the first mount may be placed on the second recess.

The entire top or bottom of the base, or the entire top and bottom of the base, may be inclined so that the thickness is smaller in the emission direction of light from the first light-emitting element and the second light-emitting element.

The bottom of the first mount may be inclined so that the thickness of the first mount is smaller in the emission direction of light from the first light-emitting element.

The top of the second mount may be inclined so that the thickness of the second mount is smaller in the emission direction of light from the second light-emitting element.

The width of the second mount may be larger as the thickness of the second mount is smaller.

The top of the first light-emitting element may be inclined so that the thickness of the first light-emitting element is smaller in the emission direction of light from the first light-emitting element.

The top of the second light-emitting element may be inclined so that the thickness of the second light-emitting element is smaller in the emission direction of light from the second light-emitting element.

The first light-emitting element may be longer in the longitudinal direction than the second light-emitting element, and an end portion of the first light-emitting element on the emission face side may protrude from the first mount as viewed from above.

The semiconductor device may further include: a support having a first surface and a second surface opposite to each other, the base being placed on the first surface; and a metal cap placed on the first surface of the support to cover the base, the first mount, the second mount, the first light-emitting element, and the second light-emitting element, an opening being formed on the side of the metal cap corresponding to the emission direction of light from the first and second light-emitting elements, wherein the base is placed so that its side faces the first surface of the support.

The second light-emitting element may emit light of a shorter wavelength than the first light-emitting element, and the light emission face of the second light-emitting element may be at a position behind the light emission face of the first light-emitting element with respect to the traveling direction of emitted light from the second light-emitting element. With this configuration, even when the diameter of the emitted light from the second light-emitting element is smaller than that of the emitted light from the first light-emitting element, adjustment of the optical axes with a relay lens and the like can be facilitated.

The first light-emitting element may selectively emit either one of light beams of two different wavelengths.

The first light-emitting element may selectively emit either a laser beam for CD or a laser beam for DVD, and the second light-emitting element may emit a laser beam for BD.

The fabrication method for a semiconductor device of an example of the present invention includes the steps of: (a) placing a first light-emitting element on the bottom of a base via a first mount; (b) placing a second light-emitting element for emitting light on the top of the base via a second mount; and (c) forming a light-transmitting resin on the top of the base for hermetically sealing the second mount and the second light-emitting element, wherein the first light-emitting element and the second light-emitting element placed in the steps (a) and (b) are positioned so that the emission direction of light from the second light-emitting element is at an angle of depression with respect to the emission direction of light from the first light-emitting element and that the emission direction of light from the first light-emitting element and the emission direction of light from the second light-emitting element substantially coincide with each other as viewed from above the base.

The above method permits fabrication of a semiconductor device in which, in use for an optical pickup, for example, the adjustment of the optical axes of the light beams emitted from the first light-emitting element and the second light-emitting element can facilitated. Also, with the hermetical sealing of the second light-emitting element in the step (c), the second light-emitting element can be effectively prevented from degradation during the fabrication process or after fabrication.

The fabrication method may further include the step of: (d) forming a first frame on the bottom of the base, the first frame being partly open and having a shape of letter "C" in plan, and forming a second frame on the top of the base, the second frame having an opening arranged to overlap the opening of the first fame as viewed from above and having a shape of letter "C" in plan, before the steps (a) and (b), wherein in the step (c), the inside of the second frame is filled with the light-transmitting resin.

The step (a) may be performed after the step (b), the step (c) may be performed before the step (a), and in the step (c), simultaneously with the formation of the light-transmitting resin on the top of the base, a first frame may be formed on the bottom of the base using a mold, the first frame being partly open, being made of a same material as the light-transmitting resin, and having a shape of letter "C" in plan.

At least part of the top or bottom of the base used in the steps (a) and (b) may be inclined so that the thickness of the base is smaller in the emission direction of light from the first light-emitting element or the second light-emitting element.

A recess having an inclined bottom may be formed on the top or bottom of the base used in the steps (a) and (b).

BRIEF DESCRIPTION OF THE DRAWINGS

FIG. 1A is a perspective view of a semiconductor device of Embodiment 1 of the present invention, and FIG. 1B includes a plan view of the semiconductor device of FIG. 1A as viewed from above a second light-emitting element (upper right), a front view as viewed from the front (upper left), and a cross-sectional view taken along a section passing through light-emitting elements in parallel with emitted laser beams (lower right).

DESCRIPTION OF THE PREFERRED EMBODIMENTS

Hereinafter, preferred embodiments of the present invention will be described with reference to the accompanying drawings.

(Embodiment 1)
-Configuration of Semiconductor Device of Embodiment 1-

Figure 1A:
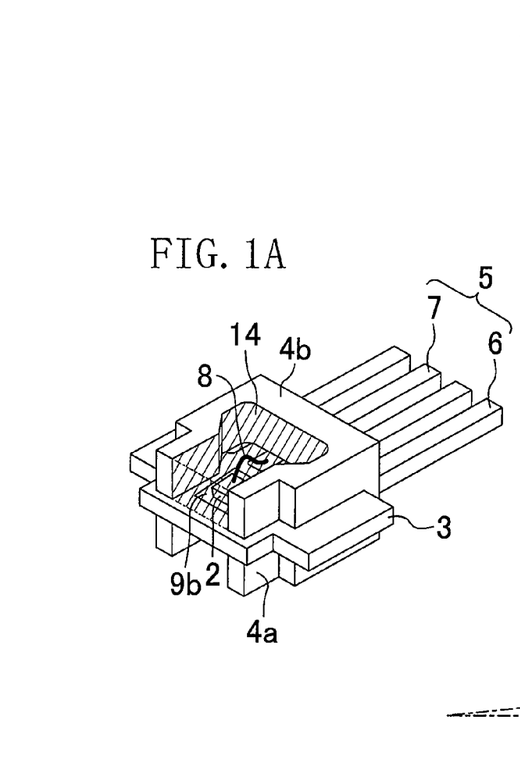
Figure 1B:
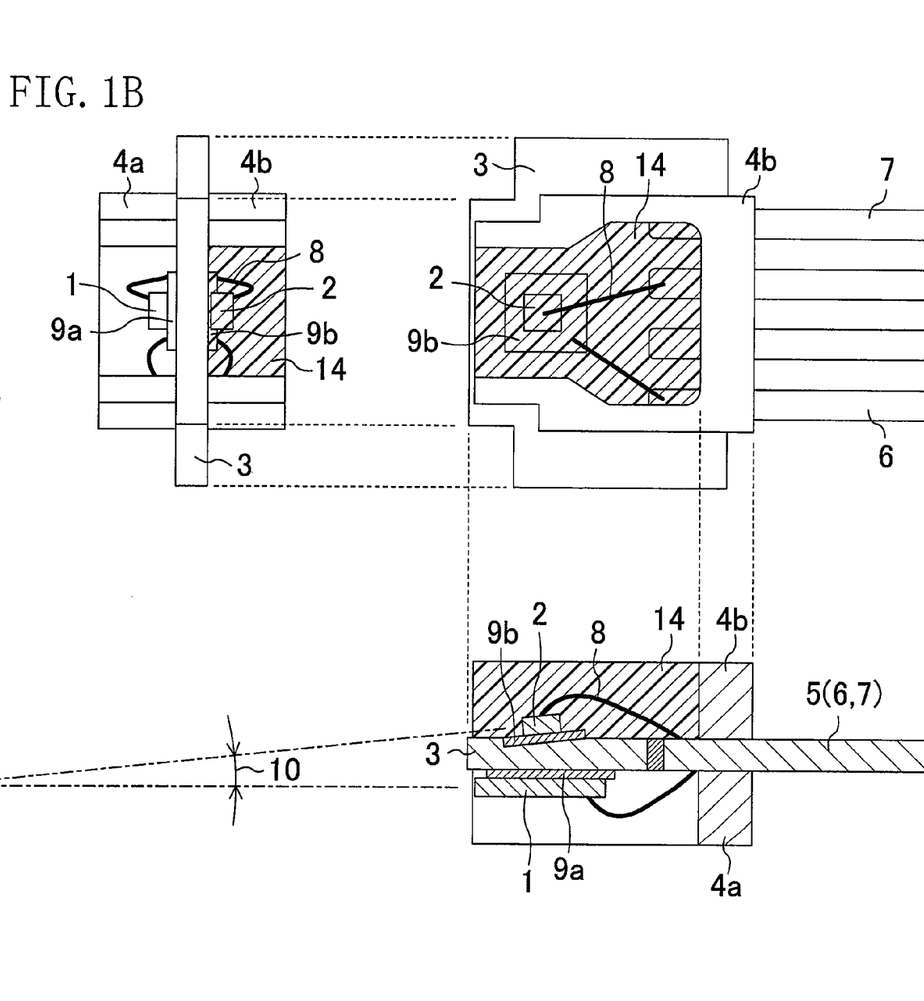

FIG. 1A is a perspective view of a semiconductor device of Embodiment 1 adapted to write/read into/from media such as a CD, a DVD, and a BD, which is capable of outputting light beams of three different wavelengths. FIG. 1B includes a plan view of the semiconductor device of FIG. 1A as viewed from above a second light-emitting element (upper right), a front view as viewed from the front (upper left), and a cross-sectional view taken along a section passing through light-emitting elements in parallel with emitted laser beams (lower right). In the lower view of FIG. 1B, the line drawn along one side and the bottom of a first light-emitting element 1 represents a first frame 4a located at the front or at the back with respect to the section of this view. In the following description, it should be note that the "top" and "bottom" of a member are expressed based on an up/down criterion that the direction of viewing a second light-emitting element 2 from a base 3 is the upward direction, as shown in the lower view of FIG. 1B.

The semiconductor device shown in FIGS. 1A and 1B includes: the base 3 having a first surface (bottom) and a second surface (top) opposite to each other; a first metal mount (first mount) 9a placed on the bottom of the base 3; the first light-emitting element 1 placed on the bottom of the first metal mount 9a; the first frame 4a placed on the bottom of the base 3; a second metal mount (second mount) 9b placed on the top of the base 3; the second light-emitting element 2 placed on the top of the second metal mount 9b; a second frame 4b placed on the top of the base 3; and a lead group 5 including a ground lead 6 and leads 7. The first light-emitting element 1 can selectively emit either a laser beam for CD or a laser beam for DVD, for example, and the second light-emitting element 2 emits a laser beam for BD. As an example, the wavelength of the laser beam for CD is 780 nm, the wavelength of the laser beam for DVD is 650 nm, and the wavelength of the laser beam for BD is 405 nm. The emission directions of the laser beams from the first light-emitting element 1 and the second light-emitting element 2 are roughly aligned with each other; the optical axes of the laser beams are arranged to coincide with each other as viewed from above. The placement of the first and second light-emitting elements 1 and 2 will be described later in detail.

The first frame 4a surrounds the first metal mount 9a and the first light-emitting element 1 except for the side corresponding to the emission direction of the laser beam from the first light-emitting element 1, as viewed in plan (viewed from below the first surface of the base 3), forming a shape similar to letter "C" in plan. In other words, the shape of the first frame 4a in plan is roughly a rectangle whose one side corresponding to the emission direction of the laser beam from the first light-emitting element 1 is open.

The second frame 4b surrounds the second metal mount 9b and the second light-emitting element 2 except for the side corresponding to the emission direction of the laser beam from the second light-emitting element 2, as viewed in plan (viewed from above the second surface of the base 3), forming a shape similar to letter "C" in plan, like the first frame 4a. In other words, the shape of the second frame 4b in plan is roughly a rectangle whose one side corresponding to the emission direction of the laser beam from the second light-emitting element 2 is open. The first frame 4a and the second frame 4b respectively protect the first light-emitting element 1 and the second light-emitting element 2 from being physically damaged in fabrication process steps after being mounted on the base 3. These frames may be made of a light-transmitting resin and the like, for example. Otherwise, it may be made of an opaque resin and the like.

On the side of the base 3 opposite to the side where the first and second frames 4a and 4b are open, provided are the ground lead 6 electrically connected to the first metal mount 9a and the second metal mount 9b and the plurality of individual leads 7 electrically isolated from each other. The lead group 5 including these leads is drawn backward from the base 3, that is, in the direction opposite to the emission direction of the laser beams from the first and second light-emitting elements 1 and 2. Inside the first frame 4a, each of the ground lead 6 and the corresponding leads 7 is connected with one end of a metal wire 8, and the first light-emitting element 1 is connected with the other end of the metal wire 8. Likewise, inside the second frame 4b, each of the ground lead 6 and the corresponding lead 7 is connected with one end of a metal wire 8, and the second light-emitting element 2 is connected with the other end of the metal wire 8. The ground lead 6 is connected to an unused portion of the surface of the first metal mount 9a or the second metal mount 9b via a metal wire 9 to be grounded.

In the semiconductor device shown in FIGS. 1A and 1B, also, the second metal mount 9b, the second light-emitting element 2, and the metal wire 8 connected to the second light-emitting element 2 are hermetically sealed with a light-transmitting resin 14 provided on the top of the base 3 inside the second frame 4b. The second light-emitting element 2, which emits light of a short wavelength compared with the first light-emitting element 1, is more prone to degradation than the first light-emitting element 1. Such degradation tends to occur because of attachment of an oxide and an organic substance to the emission facet of the light-emitting element under the light output of the light-emitting element itself and other reasons. With the above configuration, the second light-emitting element 2, which is hermetically sealed with the light-transmitting resin 14, won't be easily degraded, and as a result, a highly reliable semiconductor device can be presented. Also, an optical pickup and the like can be downsized.

Although the first light-emitting element 1 is not sealed with a light-transmitting resin in the illustrated example of FIGS. 1A and 1B, it may also be hermetically sealed like the second light-emitting element 2 for BD.

Next, the light-emitting element mounted portion will be described in detail.

As shown in FIG. 1B, in the semiconductor device of this embodiment, the first light-emitting element 1 and the second light-emitting element 2 are placed so that the emission direction of light from the second light-emitting element 2 is at an angle of depression with respect to the emission direction of light from the first light-emitting element 1 and these light emission directions coincide with each other as viewed from above the base 3. In this embodiment, the emission direction of light from the second light-emitting element 2 is at an angle of depression with respect to the top surface of the base 3 as the reference. More specifically, a recess having a bottom inclined at an angle of depression is formed on the top of the base 3, the plate-shaped second metal mount 9b is placed on this recess, and the roughly plate-shaped second light-emitting element 2 is mounted on the second metal mount 9b.

In contrast to the above, the principal plane of the first light-emitting element 1 is roughly parallel with the bottom surface of the base 3, and hence the traveling direction of the emitted light from the first light-emitting element 1 is roughly parallel with the bottom surface of the base 3. Also, as described above, the traveling direction of the emitted light from the first light-emitting element 1 and the traveling direction of the emitted light from the second light-emitting element 2 coincide with each other as viewed from above the base 3. Although the first light-emitting element 1 selectively outputs either the laser beam for CD or the laser beam for DVD, the traveling directions of the two laser beams roughly agree with each other, and hence the traveling directions of the these laser beams roughly coincide with the traveling direction of the emitted light from the second light-emitting element 2 as viewed from above the base 3.

With the configuration described above, the emitted light from the first light-emitting element 1 and the emitted light from the second light-emitting element 2 can be made to cross each other roughly at one point. Hence, a common relay lens (not shown) can be used to lead the emitted light from the first light-emitting element 1 and the emitted light from the second light-emitting element 2 onto a medium such as a disc. This facilitates adjustment of the optical axes of light beams of different wavelengths, compared with the cases of the conventional semiconductor devices, and permits downsizing of the optical pickup and the like.

In the example shown in FIGS. 1A and 1B, the second light-emitting element 2 is inclined so that the emission direction of light from the second light-emitting element 2 is at an angle of depression with respect to the top surface of the base 3 (and the emission direction of light from the first light-emitting element 1). This is because the second light-emitting element 2 is shorter in the longitudinal direction than the first light-emitting element 1, and hence is easy in machining into inclination and formation of an angle of inclination compared with the case of inclining the first light-emitting element 1. Note however that the first light-emitting element 1 may be inclined if the optical axes can be aligned so that the emission direction of light from the first light-emitting element 1 and the emission direction of light from the second light-emitting element 2 cross each other roughly at one point. In this case, also, as in the configuration of FIGS. 1A and 1B, the optical pickup and the like can be downsized and the optical axis adjustment can be facilitated.

The preferred range of an angle (angle of depression shown in FIG. 1B) 10 formed between the emission direction of light from the first light-emitting element 1 and the emission direction of light from the second light-emitting element 2 is roughly between 2° and 20° inclusive although it varies with the thickness of the base 3, the thicknesses of the first and second metal mounts 9a and 9b, the thicknesses of the first and second light-emitting elements 1 and 2, the positions of the light-emitting elements, and the like. For example, assuming that the thickness of the base 3 is 0.4 mm, the thicknesses of the first and second metal mounts 9a and 9b are 0.2 mm, and the thicknesses of the first and second light-emitting elements 1 and 2 are 0.1 mm, the preferred range of the angle 10 is about between 4° and 6° inclusive.

In the semiconductor device shown in FIGS. 1A and 1B, the edge emitting lasers are used as the first and second light-emitting elements 1 and 2. When surface emitting lasers are used, similar effects to those described above will be obtained by placing such lasers on the metal mounts so that the emission surfaces thereof face the light emission side (side where the frames are open).

Also, in the semiconductor device shown in FIGS. 1A and 1B, only the second light-emitting element 2 is inclined with respect to the base 3. Alternatively, the first light-emitting element 1 may also be inclined with respect to the base 3 to thereby allow the emitted light from the first light-emitting element 1 and the emitted light from the second light-emitting element 2 to cross each other roughly at one point. In this case, the light-emitting elements will be placed so that the emission direction of laser light from the second light-emitting element 2 is at an angle of depression with respect to the emission direction of laser light from the first light-emitting element 1.

Next, the placement of the light-emitting elements will be described.

The wavelength of the laser beam emitted from the second light-emitting element 2 for BD is shorter than the wavelengths of the two laser beams emitted from the first light-emitting element 1 for CD and DVD. For this reason, as shown in FIG. 1B, the emission face of the second light-emitting element 2 may be located rearward with respect to the emission face of the first light-emitting element 1 as viewed from the side of the semiconductor device wherein the emission face from which laser light is emitted is assumed as the front. With this placement of the second light-emitting element 2 to be rearward with respect to the first light-emitting element 1, the adjustment of the optical axes with a relay lens can be facilitated even though the diameter of the laser beam for BD is small compared with that of the laser beams for CD and DVD. Also, by appropriately adjusting the relative positions of the first and second light-emitting elements 1 and 2 mounted on the base 3, the optical adjustment of the light beams emitted therefrom can be made with high precision even though the wavelengths are different from each other.

As described above, in the semiconductor device of this embodiment, in which the optical axes of a plurality of light-emitting elements can be aligned with each other with high precision, components for optical axis adjustment, such as a mirror and a prism, can be reduced in number or even be made unnecessary. The emitted light from the first light-emitting element 1 or the second light-emitting element 2 having passed a common optical lens is focused on a CD, a DVD, or BD, and reflected light from the medium returns to the optical pickup to be received by a light-receiving element.

The light-emitting element for emitting laser beams of two wavelengths for CD and DVD is generally large in chip size, in particular, in longitudinal length, compared with the second light-emitting element for BD. Also, the first light-emitting element 1 emits light from a position of its emission face close to the first metal mount 9a. Therefore, the first light-emitting element 1 may be placed so that the end portion thereof on the emission face side protrudes from the first metal mount 9a, to thereby prevent a die bonding material for bonding the first light-emitting element 1 to the first metal mount 9a from spilling out to the emission face. In the semiconductor device shown in FIGS. 1A and 1B, also, the second light-emitting element 2 for BD is designed so that the light emitting point thereof is at a position apart from the second metal mount 9a. Therefore, the emitted light is less likely to be affected by a die bonding material even if the material spills out to part of the emission face.

-Specific Examples of Configurations for Inclining Second Light-Emitting Element 2-

Examples of configurations for placing the second light-emitting element 2 so that the emission direction of laser light therefrom is at an angle of depression with respect to the top surface of the base 3 will be described. FIGS. 2 to 5 are cross-sectional views showing specific examples of placement of the second light-emitting element 2. Note that in these figures, only the base 3, the first light-emitting element 1, the second light-emitting element 2, the first metal mount 9a, and the second metal mount 9b are shown for easy understanding.

Figure 2:
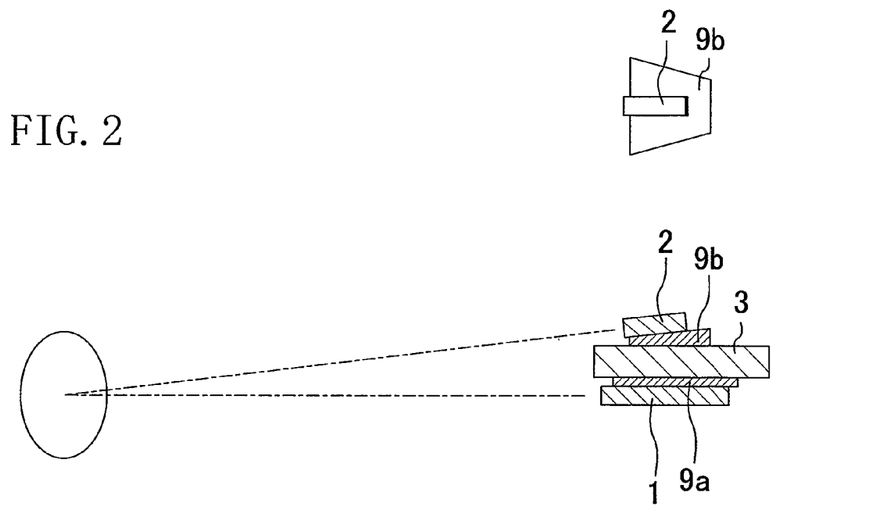
FIG. 2 is a cross-sectional view showing a specific example of placement of the second light-emitting element in the semiconductor device of Embodiment 1.

In the first specific example shown in FIG. 2, the top of the second metal mount 9b placed on the top of the base 3 is inclined with respect to the top surface of the base 3 downward toward the front. Hence, the second metal mount 9b is thinner in the emission direction of light from the first and second light-emitting elements 1 and 2. The second metal mount 9b shown in FIG. 2, therefore, has a trapezoidal shape in section. To ensure heat dissipation, the size (plane area) of the metal mount is preferably two to three times as large as that of the light-emitting element. Also, the second metal mount 9b having the inclined top may be designed so that the width becomes larger as the thickness is smaller to ensure uniform heat dissipation from the second light-emitting element 2 (see the upper view of FIG. 2). The first light-emitting element 1 and the second light-emitting element 2 are fixed to the corresponding metal mounts with a die bonding material. The first metal mount 9a and the second metal mount 9b are individually attached to the base 3 to be in tight contact with the base 3 directly or via a heat transfer material. Hence, heat generated in the first and second light-emitting elements 1 and 2 is efficiently transferred to the base 3 via the first and second metal mounts 9a and 9b.

Figure 3:
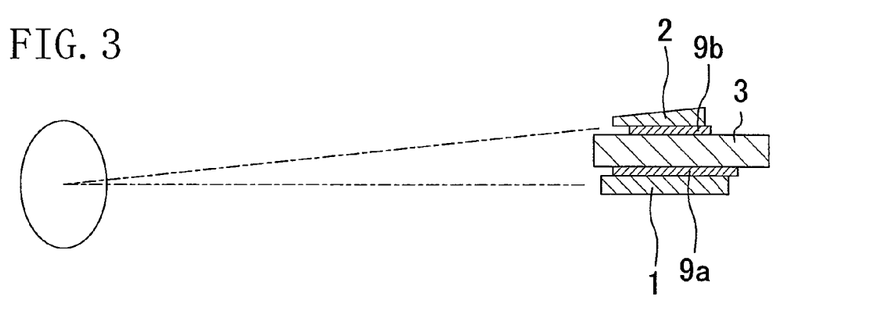
FIG. 3 is a cross-sectional view showing another specific example of placement of the second light-emitting element in the semiconductor device of Embodiment 1.

In the second specific example shown in FIG. 3, the surface of the second light-emitting element 2 to be placed on the second metal mount 9b is inclined. The second metal mount 9b has a plate shape like the first metal mount 9a. In this configuration, it is unnecessary to form an inclination on the base 3. In this case, the inclination is formed on the surface of the second light-emitting element 2 to be placed on the second metal mount 9b at a stage of a wafer before being cut into the second light-emitting elements 2.

The inclination is formed on the surface of the light-emitting element to be placed on the second metal mount 9b, after formation of the light-emitting element according to a normal process. This formation may be made by any of machining using reactive ion etching (RIE), laser machining, dicing with a blade, and the like as long as the portion required for emission such as an active layer is not damaged. Machining in the state of a wafer having a plurality of light-emitting elements arranged in a matrix has a merit that a number of light-emitting elements can be handled at one time. In this specific example, the inclination is formed on the second light-emitting element for BD. Instead, it may be formed on the first light-emitting element 1.

Figure 4:
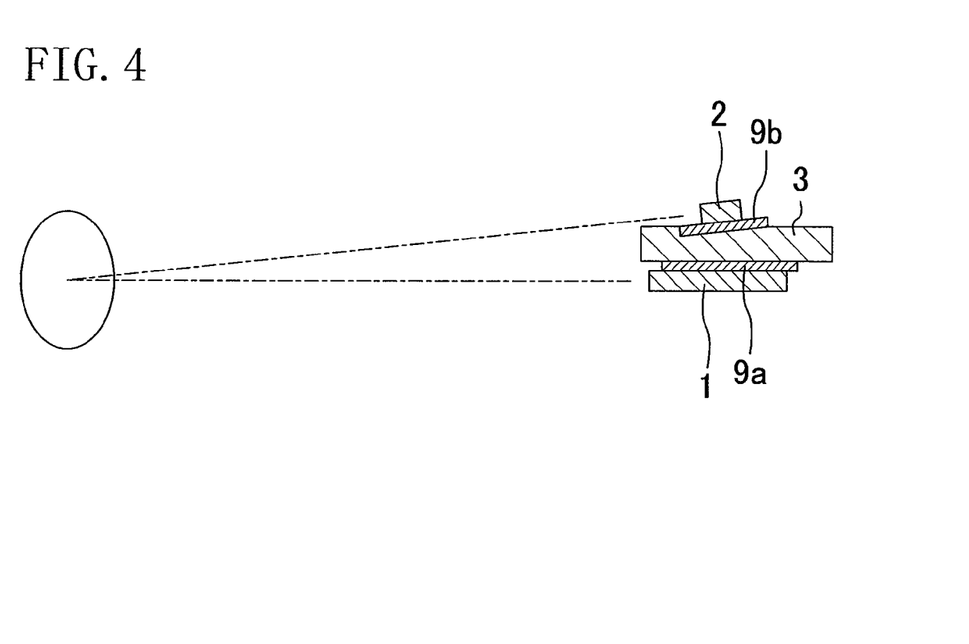
FIG. 4 is a cross-sectional view showing yet another specific example of placement of the second light-emitting element in the semiconductor device of Embodiment 1.
Figure 5:
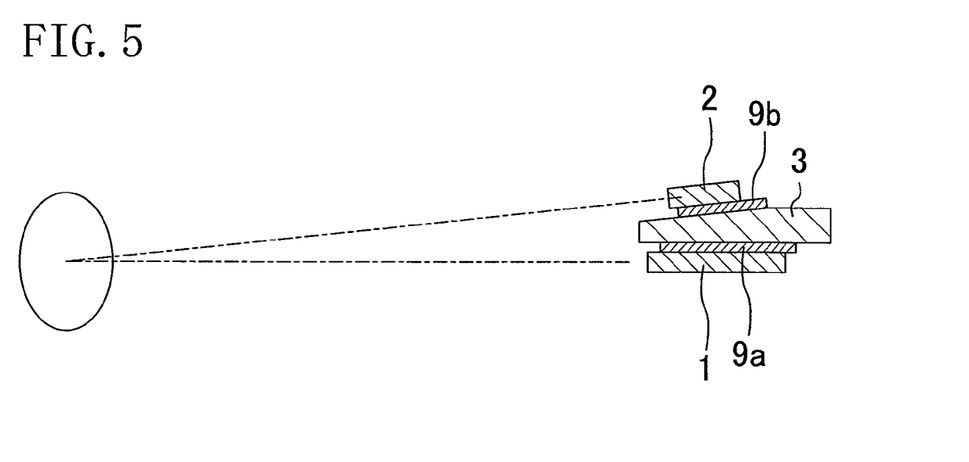
FIG. 5 is a cross-sectional view showing yet another specific example of placement of the second light-emitting element in the semiconductor device of Embodiment 1.

In the third specific example shown in FIG. 4, a recess having an inclined bottom is formed on the top of the base 3, as in the semiconductor device shown in FIG. 1B. The second metal mount 9b and the second light-emitting element 2 both having a plate shape are sequentially placed on this recess, so that the emission direction of light from the second light-emitting element 2 can be at an angle of depression. This recess may be formed inside the second frame 4b as viewed from above. Otherwise, as shown in FIG. 5, the top of the base 3 may be entirely inclined so that the base 3 is thinner in the emission direction of light from the first and second light-emitting elements 1 and 2. Both the top and bottom of the base 3 may be inclined. Otherwise, only the bottom of the base 3 may be inclined.

By adjusting the positional relationship between the first light-emitting element 1 and the second light-emitting element 2, the direction of the emitted light, and the like as described above, it is possible to share, or reduce, the members for aligning the emission direction of the laser beam from the first light-emitting element 1 and the emission direction of the laser beam from the second light-emitting element 2 with each other. Hence, the device can be downsized.

Next, an example of a fabrication method for the semiconductor device shown in FIGS. 1A and 1B will be described.

-Fabrication Method for Semiconductor Device of FIGS. 1A and 1B-

Figure 6A:
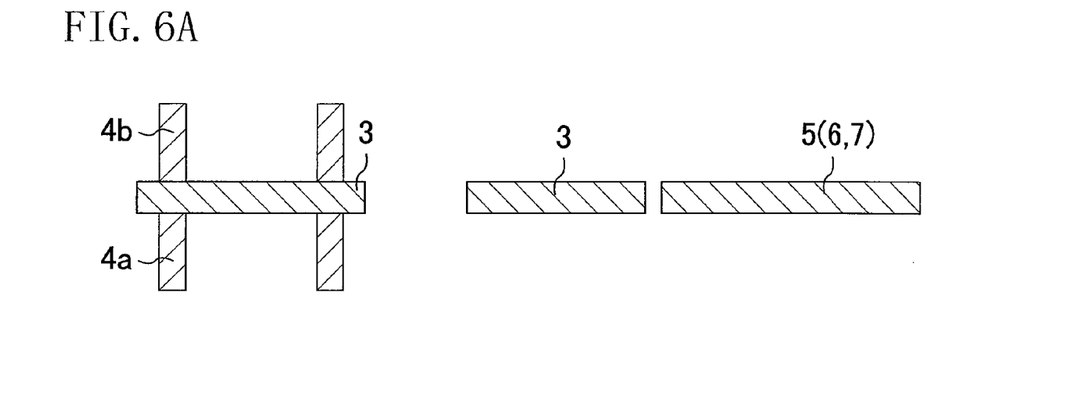
FIGS. 6A to 6C each include front views (left) and side cross-sectional views (right) showing major process steps for the semiconductor device of Embodiment 1.
Figure 6B:
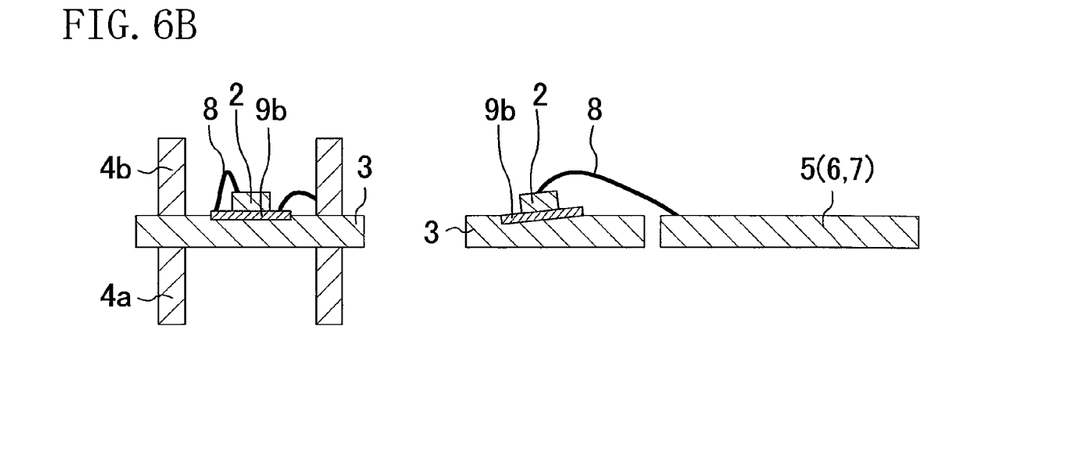
Figure 6C:
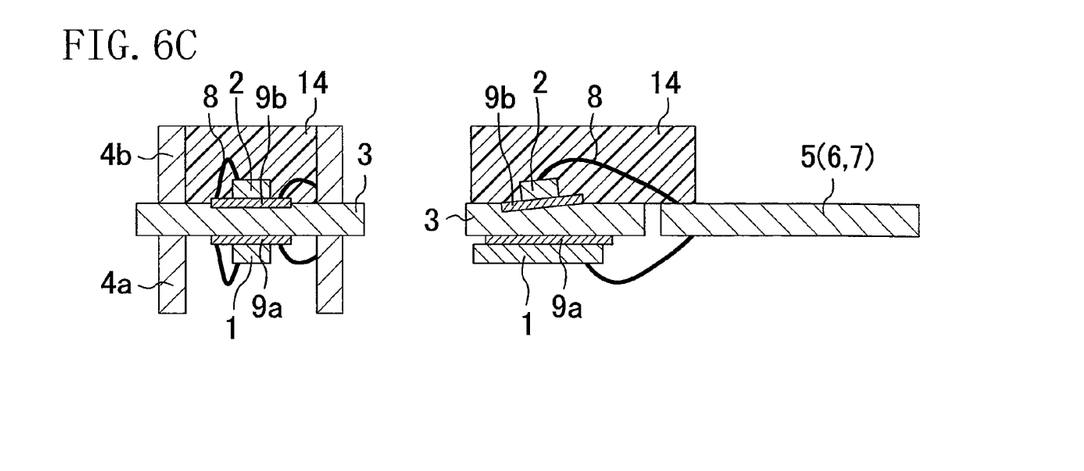

FIGS. 6A to 6C each include front cross-sectional views (left) and side cross-sectional views (right) showing major process steps for the semiconductor device of Embodiment 1. Note that the frames are omitted in the right views of the FIGS. 6A to 6C.

First, in the step shown in FIG. 6A, prepared is a lead frame having the ground lead 6 linking with the base 3, the plurality of leads 7 that are roughly parallel with the ground lead 6 and isolated from the base 3, and a frame connected to one end of each of the plurality of leads 7 and the ground lead 6. Subsequently, the first frame 4a made of a resin having an opening in the front is formed on the bottom of the base 3, while the second frame 4b made of a resin having an opening in the front is formed on the top of the base 3, using a sealing mold. Note that the first and second frames 4a and 4b are both in a shape of letter "C" in plan, and are placed so that both openings face the same direction.

In the step shown in FIG. 6B, the top of the base 3 is machined to form a recess having a bottom inclined at an angle of depression with respect to the top surface of the base 3. The recess is formed in the center region of the top of the base 3, for example. When forming a recess on a portion of the top of the base 3 as shown in FIG. 4, RIE, laser machining, and the like described above should preferably be used. When adopting the specific example shown in FIG. 5, dicing may be used in addition to the above machining methods.

Subsequently, the second metal mount 9b is placed on the recess of the base 3, and then the second light-emitting element 2 for BD is placed on the top of the second metal mount 9b. This placement is made so that the emission direction of light from the light-emitting element is toward the front of the base 3. Thereafter, a metal wire 8 for connecting the ground lead 6 with the second metal mount 9b and a metal wire 8 for connecting the second light-emitting element 2 with the corresponding lead 7 are formed. Specifically, the ground lead 6 and an unused portion of the top of the second metal mount 9a are connected with each other via a metal wire 8, and the second light-emitting element 2 and the corresponding lead 7 are connected with each other via a metal wire 8.

In the step shown in FIG. 6C, the light-transmitting resin 14 for sealing the second metal mount 9b, the second light-emitting element 2, and the metal wires 8 is formed on the top of the base 3 inside the second frame 4b. With this, the second light-emitting element 2 is hermetically sealed, and hence prevented from degradation in the subsequent steps. Accordingly, the reliability is higher in the semiconductor device shown in FIGS. 1A and 1B than in the conventional semiconductor devices. Note that in the above step, the second light-emitting element 2 may be mounted on the second metal mount 9b in advance, and thereafter the second metal mount 9b with the second light-emitting element 2 mounted thereon may be mounted on the base 3.

Subsequently, the first metal mount 9a is placed in the center region of the bottom of the base 3 inside the first frame 4a. The first light-emitting element 1 is then placed on the bottom of the first metal mount 9a by soldering and the like. At this soldering, the first light-emitting element 1 is preferably placed so that the end portion thereof on the emission face side protrudes a little from the first metal mount 9a. Also, the first light-emitting element 1 is placed so that the emission face thereof faces the opening of the first frame 4a, and that the traveling direction of the emitted light coincides with the traveling direction of the emitted light from the second light-emitting element 2 as viewed from above and also crosses the traveling direction of light from the second light-emitting element 2 at one point. To facilitate the adjustment of the optical axes, the first light-emitting element 1 may be placed at a position ahead of the second light-emitting element 2 with respect to the emitted light traveling direction.

Thereafter, a metal wire 8 for connecting the ground lead 6 with the first metal mount 9a and metal wires 8 for connecting the first light-emitting element 1 with the corresponding leads 7 are formed. Specifically, the ground lead 6 and an unused portion of the first metal mount 9a are connected with each other via a metal wire 8, and the first light-emitting element 1 and the corresponding leads 7 are connected with each other via metal wires 8. Thereafter, the linkage between the frame and the lead group is cut off to obtain an individual semiconductor device. The individual semiconductor device is sequentially subjected to testing of electrical properties and appearance testing, to obtain a conforming semiconductor device.

Note that in the step shown in FIG. 6B, formation of the recess is unnecessary when the optical axes can be adjusted without the necessity of inclining the second light-emitting element 2, or when the top of the second metal mount 9b is inclined.

It is unnecessary to seal the first light-emitting element 1 for CD and DVD with a light-transmitting resin and the like because the first light-emitting element 1 is resistant to degradation compared with the second light-emitting element 2. Note however that if the first light-emitting element 1 is to be sealed with the same resin as the second light-emitting element 2, the sealing may be made simultaneously by transfer molding.

The first frame 4a for protecting the first light-emitting element 1 and the second frame 4b for protecting the second light-emitting element 2 may be made of the same material, or made of different materials from each other. For example, the frame may be formed also on the surface on which the second light-emitting element 2 for BD is mounted, and thereafter, the frame may be covered with a metal plate (metal cap) with only the portion from which light is emitted being covered with a transparent member, or may be hermetically sealed with a sealing material filling the inside of the frame.

Although the fabrication method described above was for the semiconductor device shown in FIGS. 1A and 1B, it is also possible to fabricate semiconductor devices adopting the specific examples shown in FIGS. 2, 3, and 5 in similar procedures.

-Alteration of Semiconductor Device of Embodiment 1-

Figure 7A:
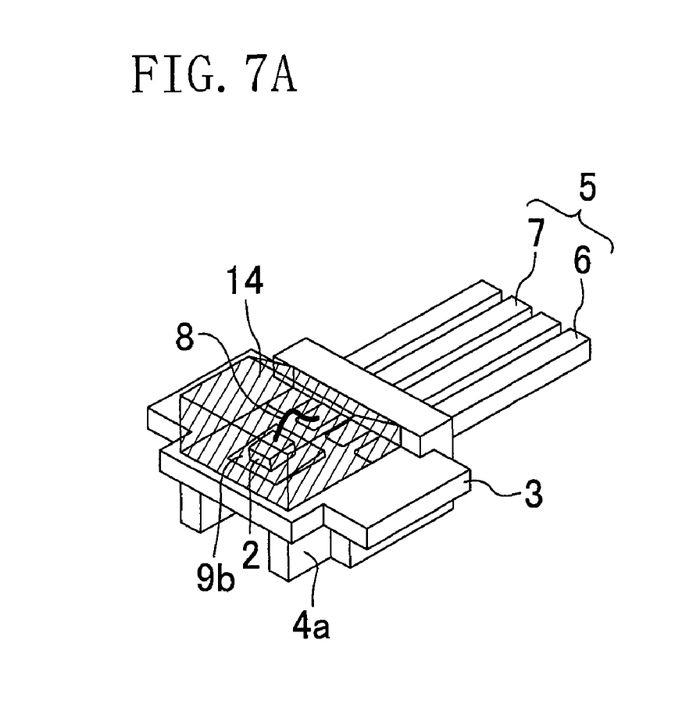
FIG. 7A is a perspective view of an alteration of the semiconductor device of Embodiment 1.
Figure 7B:
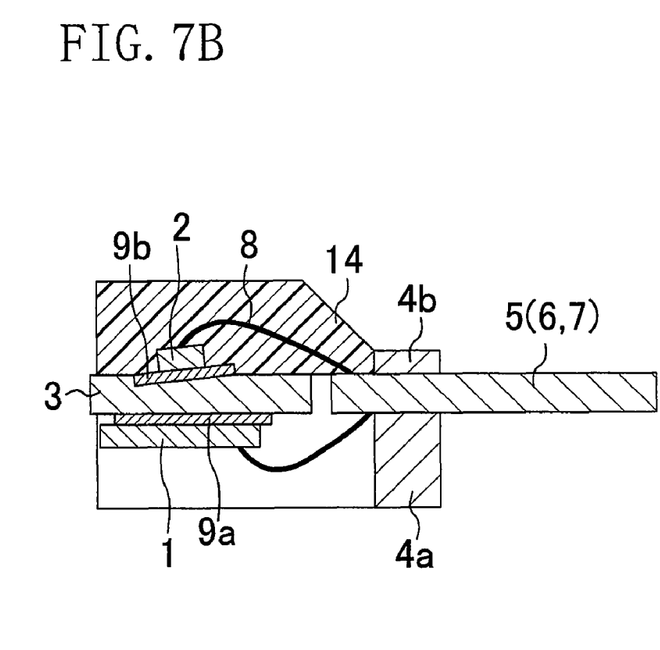
FIG. 7B is a cross-sectional view of the semiconductor device of FIG. 7A in the light emission direction.

FIG. 7A is a perspective view of an alteration of the semiconductor device of Embodiment 1, and FIG. 7B is a cross-sectional view of the semiconductor device of FIG. 7A taken in the light emission direction. As shown in FIGS. 7A and 7B, the second metal mount 9b and the second light-emitting element 2 of the semiconductor device shown in FIGS. 1A and 1B may be sealed with the light-transmitting resin 14 without formation of the second frame 4b.

Specifically, as shown in FIGS. 7A and 7B, the first frame 4a is formed on the bottom of the base 3, and has a roughly rectangular shape in plan with one side corresponding to the emission direction of laser light from the first light-emitting element 1 being open, or a shape of letter "C".

On the side opposite to the open side of the first frame 4a, provided are the ground lead 6 electrically connected to the first metal mount 9a and the second metal mount 9b and the plurality of individual leads 7 electrically isolated from each other. The shape of the lead group 5 including these leads is similar to that in the semiconductor device shown in FIGS. 1A and 1B. The ground lead 6 is connected to the first metal mount 9a or the second metal mount 9b via a metal wire 8, and each of the leads 7 is connected to the first light-emitting element 1 or the second light-emitting element 2 via a metal wire 8.

As described above, in the semiconductor device of this alteration, in which no second frame is provided, the second metal mount 9b and the second light-emitting element 2 are sealed with the light-transmitting resin 14. The first light-emitting element 1 for CD and DVD is surrounded with the first frame 4a but is not hermetically sealed, although it may also be sealed with a light-transmitting resin. The first frame 4a may be made of the same material as the light-transmitting resin 14 or made of a different material. When the first frame 4a is made of the same material as the light-transmitting resin 14, they may be formed simultaneously using a sealing mold. This can reduce the number of fabrication steps.

With the configuration of this alteration, also, in which the second light-emitting element that is prone to degradation is hermetically sealed, it is possible to prevent degradation and improve the reliability of the semiconductor device.

Also, like the semiconductor device shown in FIGS. 1A and 1B, the emission direction of light from the second light-emitting element 2 may be inclined with respect to the top surface of the base 3. In this case, the preferred range of the angle formed between the emission direction of light from the first light-emitting element 1 and the emission direction of light from the second light-emitting element 2 is roughly between 2° and 20° inclusive although it varies with the thickness of the base 3, the thicknesses of the first and second metal mounts 9a and 9b, the thicknesses of the first and second light-emitting elements 1 and 2, the positions of the light-emitting elements, and the like. For example, assuming that the thickness of the base 3 is 0.4 mm, the thicknesses of the first and second metal mounts 9a and 9b are 0.2 mm, and the thicknesses of the first and second light-emitting elements 1 and 2 are 0.1 mm, the preferred range of the angle formed between the emission direction of light from the first light-emitting element 1 and the emission direction of light from the second light-emitting element 2 is about between 4° and 6° inclusive.

-Fabrication Method for Semiconductor Device of Alteration of Embodiment 1-

Figure 8A:
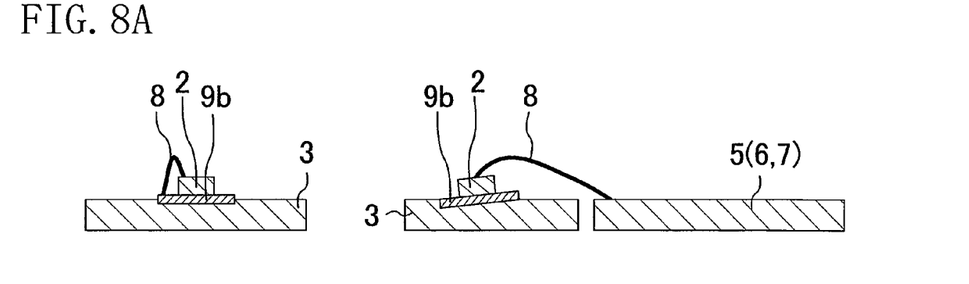
FIGS. 8A to 8C each include front views (left) and side cross-sectional views (right) showing major process steps for the semiconductor device of the alteration of Embodiment 1.
Figure 8B:
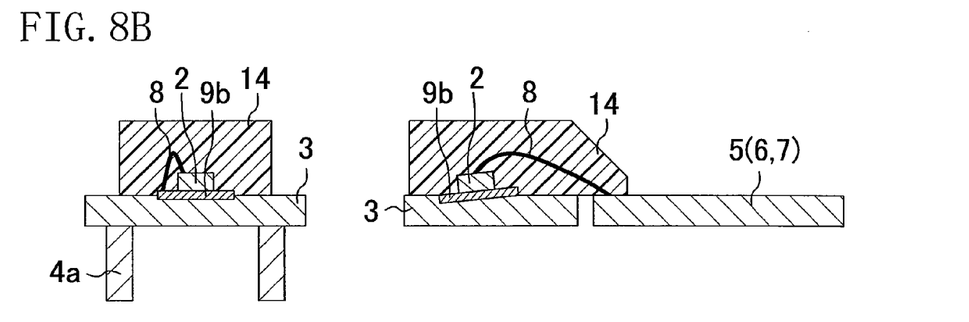
Figure 8C:
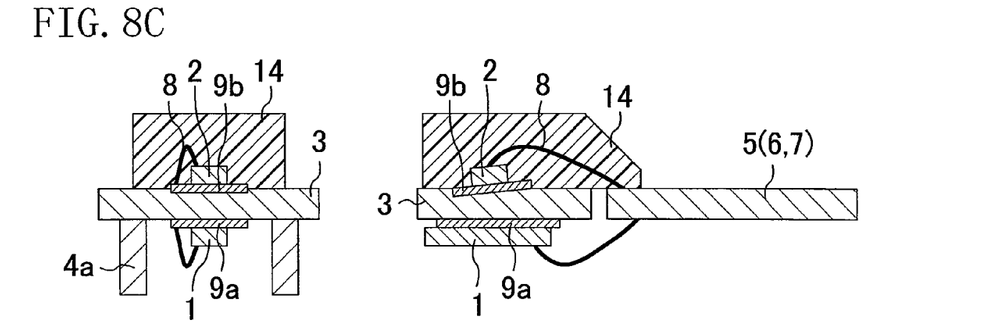

FIGS. 8A to 8C each include front cross-sectional views (left) and side cross-sectional views (right) showing major steps of a fabrication method for the semiconductor device of the alteration of Embodiment 1. Note that the first frame 4a is omitted in the right views of the FIGS. 8A to 8C.

First, in the step shown in FIG. 8A, prepared is a lead frame having the ground lead 6 linking with the base 3, the plurality of leads 7 that are roughly parallel with the ground lead 6 and isolated from the base 3, and a frame connected to one end of each of the plurality of leads 7 and the ground lead 6. Thereafter, a recess is formed on the top of the base 3, if necessary, and the second metal mount 9b and then the second light-emitting element 2 are placed on the top of, or on the recess of the top of, the base 3. When the recess is formed, the bottom thereof is inclined with respect to the top surface of the base 3 at an angle of depression.

Subsequently, the ground lead 6 and an unused portion of the second metal mount 9b are connected with each other via a metal wire 8, and the second light-emitting element 2 and the corresponding lead 7 are connected with each other via a metal wire 8.

In the step shown in FIG. 8B, the first frame 4a made of a transparent resin having an opening in the front is formed on the bottom of the base 3, while the light-transmitting resin 14 is formed on the top of the base 3 for hermetically sealing the second metal mount 9b and the second light-emitting element 2. In this step, the first frame 4a and the light-transmitting resin 14 are formed simultaneously by injection molding using a mold, for example. This permits prevention of the second light-emitting element 2 from degradation, while permitting prevention of the first light-emitting element 1 from physical damage, with a reduced number of steps. Hence, the reliability is higher in the semiconductor device shown in FIGS. 7A and 7B than in the conventional semiconductor devices.

In the step shown in FIG. 8C, the first metal mount 9a is formed in the center region of the bottom of the base 3 inside the first frame 4a. The first light-emitting element 1 is then placed on the bottom of the first metal mount 9a by soldering and the like. At this soldering, the first light-emitting element 1 is preferably placed so that the end portion thereof on the emission face side protrudes a little from the first metal mount 9a. Also, the first light-emitting element 1 is placed so that the emission face thereof faces the opening of the first frame 4a, that the traveling direction of the emitted light coincides with the traveling direction of the emitted light from the second light-emitting element 2 as viewed from above, and that the emitted light crosses the optical axis of the second light-emitting element 2 at one point. To facilitate the adjustment of the optical axes, the first light-emitting element 1 may be placed ahead of the second light-emitting element 2 with respect to the emitted light traveling direction.

Thereafter, the ground lead 6 and an unused portion of the first metal mount 9a are connected with each other via a metal wire 8, and the first light-emitting element 1 and the corresponding leads 7 are connected with each other via metal wires 8. Thereafter, the linkage between the frame and the lead group is cut off to obtain an individual semiconductor device. The individual semiconductor device is sequentially subjected to testing of electrical properties and appearance testing, to obtain a conforming semiconductor device.

In the fabrication method of the alteration described above, in which the second light-emitting element 2 is hermetically sealed with the light-transmitting resin 14 including the second frame 4b, the second light-emitting element 2 can be effectively prevented from degradation. Also, when a recess is formed, the traveling direction of the emitted light from the second light-emitting element 2 forms an angle of depression with respect to the top surface of the base and the emission direction of light from the first light-emitting element 1. Hence, optical-axis alignment of the emitted light beams from the first light-emitting element 1 and the second light-emitting element 2 can be facilitated. Also, in the step shown in FIG. 8A, the top of the base 3 may be entirely inclined. In this case, also, a similar effect to that obtained when the recess is formed can be obtained.

It is sufficient for the first light-emitting element 1 to be only mechanically protected with the first frame 4a, and no problem will arise in actual use when it is not hermetically sealed with a resin and the like.

In the method in this alteration, a material and means different from those presented above may be used for hermetically sealing the second light-emitting element 2 for BD. For example, the second light-emitting element 2 may be hermetically sealed with a transparent sealing material filling the inside of the second frame 4b.

In the above method, since the steps of mounting the second light-emitting element 2 emitting a short-wavelength laser beam on the base 3 and hermetically sealing the second light-emitting element 2 are steps in the latter part of the fabrication process, they are not affected by such problems as temporary storage and retention during assembly. Hence, according to this method, a highly reliable semiconductor device can be supplied without being easily degraded.

(Embodiment 2)

Figure 9A:
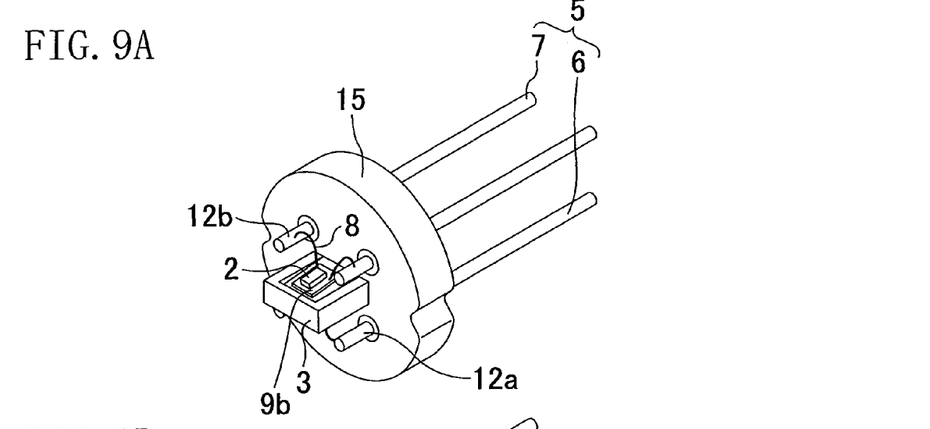
FIGS. 9A and 9B are perspective views showing a structure of a semiconductor device of Embodiment 2 of the present invention, and FIG. 9C includes a front view (left) and a cross-sectional view (right) of the semiconductor device.
Figure 9B:
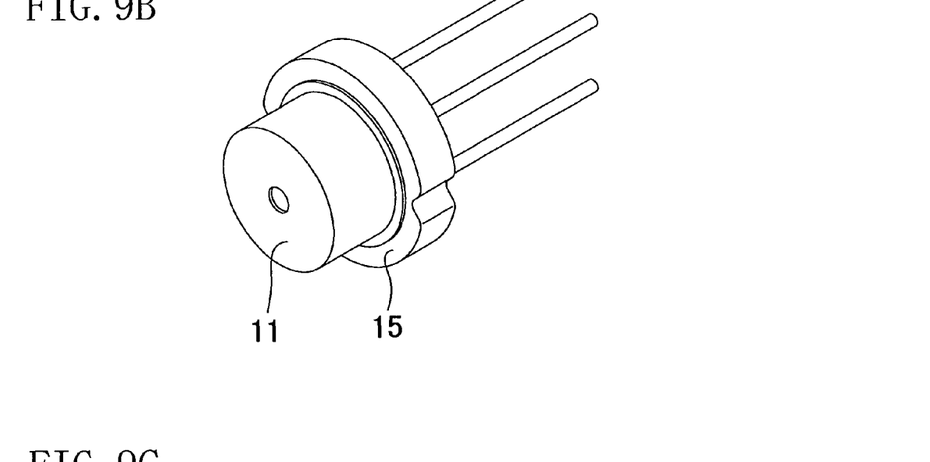
Figure 9C:
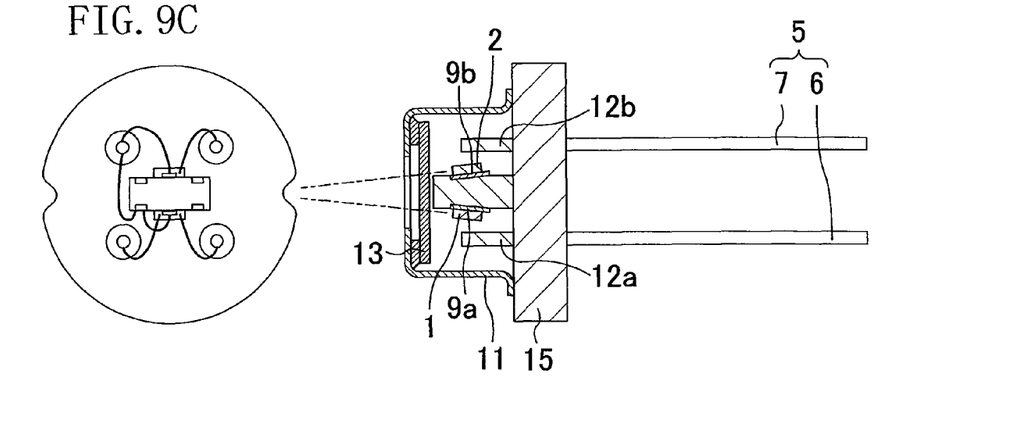

FIGS. 9A and 9B are perspective views showing a structure of a semiconductor device of Embodiment 2, and FIG. 9C includes a front view (left) and a cross-sectional view (right) of the semiconductor device. Note that FIG. 9A and the left view of FIG. 9C show the semiconductor device with a metal cap 11 removed therefrom for illustration of the structure. The semiconductor device shown in FIGS. 9A to 9C is in a form of a CAN package having a metal cap. The semiconductor device of this embodiment also, like the semiconductor device of Embodiment 1, can emit light beams of at least three types of wavelengths used for write/read into/from media such as a CD, a DVD, and a BD. The first light-emitting element 1 selectively emits a laser beam for CD and a laser beam for DVD, and the second light-emitting element 2 emits a laser beam for BD.

As shown in FIGS. 9A to 9C, the semiconductor device of this embodiment includes: a support 15 roughly in a disc shape, for example, having a first surface and a second surface opposite to each other; a base 3 placed o the first surface of the support 15 so that one side thereof faces the support 15; a first light-emitting element 1 placed on the bottom (as viewed from FIG. 9C) of the base 3 via a first metal mount 9a; a second light-emitting element 2 placed on the top (as viewed from FIG. 9C) of the base 3 via a second metal mount 9b; the metal cap 11 that is put on the first surface of the support 15, has an opening on the side corresponding to the emission direction of laser light from the first and second light-emitting elements 1 and 2, and covers the base 3, the first light-emitting element 1, and the second light-emitting element 2; a transparent member 13 made of glass and the like covering the opening of the metal cap 11; and a lead group including a ground lead 6 and leads 7. The ground lead 6 and the leads 7 extend from portions (inner leads 12a and 12b) inside the metal cap 11 through the support 15 in the direction opposite to the emission direction of laser light from the first and second light-emitting elements 1 and 2. The ground lead 6 is electrically connected to the first metal mount 9a or the second metal mount 9b via a metal wire 8, and each of the leads 7 is electrically connected to the first light-emitting element 1 or the second light-emitting element 2 via a metal wire 8. The lead group 5 is electrically isolated from the support 15.

The metal cap 11, the opening on the top of which is covered with the transparent member 13 and the rim of which is attached to the first surface of the support 15, hermetically seals the first light-emitting element 1 and the second light-emitting element 2. With this, the second light-emitting element 2 is prevented from degradation. The emitted light beams from the first and second light-emitting elements land 2 are outputted outside from the opening of the metal cap 11.

The first light-emitting element 1 and the second light-emitting element 2 are inclined so that the emission direction of light from the second light-emitting element 2 is at an angle of depression with respect to the emission direction of light from the first light-emitting element 1. As shown in FIGS. 9A to 9C, recesses having an inclined bottom may be formed on portions of the top and bottom of the base 3 on which the first and second metal mounts 9a and 9b are to be mounted. Alternatively, the top and bottom of the base 3 may be entirely inclined to allow the emission direction of light from the second light-emitting element 2 to be at an angle of depression with respect to the emission direction of light from the first light-emitting element 1. Otherwise, as described in Embodiment 1, a recess or a slope may be formed on each of the first metal mount 9a and the second metal mount 9b, or a slope may be formed on each of the first light-emitting element 1 and the second light-emitting element 2 themselves. Note that the optical axes of the two types of emitted light beams from the first light-emitting element 1 and the optical axis of the emitted light beam from the second light-emitting element 2 should preferably roughly coincide with each other as viewed from above the base 3.

By adopting the configuration described above, the first light-emitting element 1 and the second light-emitting element 2 are placed so that the optical axis of the emitted light from the first light-emitting element 1 crosses the optical axis of the emitted light from the second light-emitting element 2 at one point. Hence, the optical axis of the emitted light from the first light-emitting element 1 and the optical axis of the emitted light from the second light-emitting element 2 can be easily aligned with each other with a common relay lens, and thus the number of optical members can be greatly reduced compared with the case of the conventional semiconductor devices.

Note that in the semiconductor device of this embodiment, the plane area of each of the first and second metal mounts 9a and 9b is preferably about two to three times as large as that of the corresponding light-emitting element placed thereon to ensure good heat dissipation. Also, in the case that the surface of the metal mount on which the light-emitting element is mounted is inclined, the metal mount may be designed so that the width is gradually larger as the thickness is smaller to ensure uniform heat dissipation from the light-emitting element.

In FIGS. 9A and 9C, the inner leads 12a and 12b of the lead group 5 are placed at upper-right, upper-left, lower-right, and lower-left positions as viewed from the front. Alternatively, they may be placed at positions other than the above, and the number of inner leads is not limited to this.

Note that the configuration of the semiconductor device of this embodiment can be combined with any of the specific examples and alteration of Embodiment 1 within the range not departing from the gist of the present invention.

-Fabrication Method for Semiconductor Device of Embodiment 2-

A fabrication method for the semiconductor device of Embodiment 2 will be described with reference to FIGS. 9A to 9C.

First, the following are prepared: the roughly disc-shaped support 15 with the base 3 attached to the first surface thereof; and the lead group 5 extending through the support at positions in the peripheral region in terms of the first and second surfaces thereof while being electrically isolated from the support 15. The lead group 5 includes the ground lead 6 connected to a metal mount in a later step and the leads 7 connected to the light-emitting elements also in a later step. The portion of the ground lead 6 protruding from the first surface serves as the inner lead 12a, while the portion of each lead 7 protruding from the first surface serves as the inner lead 12b. The portions of the lead group 5 protruding from the second surface serve as external terminals. Note that a recess having a bottom inclined closer to the center axis of the support 15 (in terms of the first and second surfaces) in the direction apart from the support 15 may be formed on a portion of each of the top and bottom of the base 3 prepared in this step.

Thereafter, the first metal mount 9a is placed in the center region of the bottom of the base 3, and the first light-emitting element 1 is then placed on the bottom of the first metal mount 9a so as to protrude a little from the first metal mount 9a in the emission direction of light from the first light-emitting element 1. Subsequently, metal wires 8 are formed for connecting the corresponding inner leads 12b with the first light-emitting element 1. Note that when the recess is formed on the bottom of the base 3, the first metal mount 9a is placed on the recess.

Thereafter, the second metal mount 9b is placed in the center region of the top of the base 3, and the second light-emitting element 2 is then placed on the top of the second metal mount 9b. Subsequently, a metal wire 8 is formed for connecting the corresponding inner lead 12b with the second light-emitting element 2. The second light-emitting element 2 may be placed at a position behind the first light-emitting element 1 with respect to the laser light emission direction as viewed from above the base 3, to thereby facilitate the adjustment of the optical axes with a relay lens, for example.

Thereafter, the metal cap 11 with the transparent member 13 covering the opening being placed on the cap top is attached to the first surface of the support 15, to hermetically seal the first light-emitting element 1 and the second light-emitting element 2. After subsequent steps of testing of electrical properties and appearance testing, the semiconductor device of this embodiment is completed.

In the method described above, the recesses may not be formed on the base 3, and instead both the top and bottom of the base 3 may be entirely inclined. Otherwise, the bottom of the first metal mount 9a and the top of the second metal mount 9b may be inclined.

As described above, the second light-emitting element 2 for BD for emitting an especially short-wavelength laser beam, which is prone to degradation compared with the first light-emitting element 1, is prevented from degradation by being hermetically sealed with the metal cap 11. The first light-emitting element 1 may or may not be hermetically sealed; if not being sealed, it can be operated without any trouble. However, to prevent mechanical damage, it is preferred to seal the first light-emitting element 1 also with the metal cap 11. According to the semiconductor device of this embodiment, in which the emission direction of light from the first light-emitting element 1 and the emission direction of light from the second light-emitting element 2 roughly cross each other, the adjustment of the optical axes of laser beams of different wavelengths is facilitated. Hence, with the configuration of this embodiment, also, it is possible to provide a semiconductor device with improved reliability that is stable in write/read into/from a medium and permits downsizing of an optical pickup and the like.

As described above, the semiconductor device of an example of the present invention is favorably used for electronic equipment for writing/reading data using light beams of different wavelengths for CD, DVD, BD, and the like.

The foregoing description illustrates and describes the present disclosure. Additionally, the disclosure shows and describes only the preferred embodiments of the disclosure, but, as mentioned above, it is to be understood that it is capable of changes or modifications within the scope of the concept as expressed herein, commensurate with the above teachings and/or skill or knowledge of the relevant art. The described hereinabove are further intended to explain best modes known of practicing the invention and to enable others skilled in the art to utilize the disclosure in such, or other embodiments and with the various modifications required by the particular applications or uses disclosed herein. Accordingly, the description is not intended to limit the invention to the form disclosed herein. Also it is intended that the appended claims be construed to include alternative embodiments.

What is claimed is:

1. A semiconductor device comprising:
a base;
a first mount placed on the bottom of the base;
a second mount placed on the top of the base;
a first light-emitting element placed on the bottom of the first mount;
a second light-emitting element placed on the top of the second mount for emitting light;
a first frame placed on the bottom of the base to surround the first mount and the first light-emitting element except for the side corresponding to the emission direction of light from the first light-emitting element;
a plurality of leads electrically connected to any one of the first light-emitting element, the second light-emitting element, the first mount, and the second mount; and
a light-transmitting resin placed on the top of the base for hermetically sealing the second light-emitting element, the second mount, and part of each of the plurality of leads,
wherein the first light-emitting element and the second light-emitting element are placed so that the emission direction of light from the second light-emitting element is at an angle of depression with respect to the emission direction of light from the first light-emitting element and that the emission direction of light from the first light-emitting element and the emission direction of light from the second light-emitting element substantially coincide with each other as viewed from above the base,
the base is inclined so that the thickness is smaller in the emission direction of light from the first light-emitting element and the second light-emitting element,
the second light-emitting element emits light of a shorter wavelength than the first light-emitting element, and
the light emission face of the second light-emitting element is at a position behind the light emission face of the first light-emitting element with respect to the traveling direction of emitted light from the second light-emitting element.

2. A semiconductor device comprising:
a base;
a first mount placed on the bottom of the base;
a second mount placed on the top of the base;
a first light-emitting element placed on the bottom of the first mount;
a second light-emitting element placed on the top of the second mount for emitting light;
a first frame placed on the bottom of the base to surround the first mount and the first light-emitting element except for the side corresponding to the emission direction of light from the first light-emitting element;
a plurality of leads electrically connected to any one of the first light-emitting element, the second light-emitting element, the first mount, and the second mount; and
a light-transmitting resin placed on the top of the base for hermetically sealing the second light-emitting element, the second mount, and part of each of the plurality of leads,
wherein the first light-emitting element and the second light-emitting element are placed so that the emission direction of light from the second light-emitting element is at an angle of depression with respect to the emission direction of light from the first light-emitting element and that the emission direction of light from the first light-emitting element and the emission direction of light from the second light-emitting element substantially coincide with each other as viewed from above the base,
the top of the second mount is inclined so that the thickness of the second mount is smaller in the emission direction of light from the second light-emitting element,
the second light-emitting element emits light of a shorter wavelength than the first light-emitting element, and
the light emission face of the second light-emitting element is at a position behind the light emission face of the first light-emitting element with respect to the traveling direction of emitted light from the second light-emitting element.

3. The semiconductor device of claim 2, wherein the first frame and the light-transmitting resin are made of a same material.

4. The semiconductor device of claim 2, further comprising:
a second frame placed on the top of the base to surround the second mount and the second light-emitting element except for the side corresponding to the emission direction of light from the second light-emitting element.

5. The semiconductor device of claim 2, wherein the bottom of the first mount is inclined so that the thickness of the first mount is smaller in the emission direction of light from the first light-emitting element.

6. The semiconductor device of claim 2, wherein the width of the second mount is larger as the thickness of the second mount is smaller.

7. The semiconductor device of claim 2, wherein the first light-emitting element is longer in the longitudinal direction than the second light-emitting element, and
an end portion of the first light-emitting element on the emission face side protrudes from the first mount as viewed from above.

8. The semiconductor device of claim 2, wherein the second light-emitting element emits light of a shorter wavelength than the first light-emitting element, and
the light emission face of the second light-emitting element is at a position behind the light emission face of the first light-emitting element with respect to the traveling direction of emitted light from the second light-emitting element.

9. The semiconductor device of claim 2, wherein the first light-emitting element selectively emits either one of light beams of two different wavelengths.

* * * * *